United States Patent [19]

Nakamura et al.

[11] Patent Number: 5,312,774
[45] Date of Patent: May 17, 1994

[54] METHOD FOR MANUFACTURING A SEMICONDUCTOR DEVICE COMPRISING TITANIUM

[75] Inventors: Kazuyo Nakamura, Tenri; Keiichiro Uda, Nara; Osamu Yamazaki, Nara; Hiromi Hattori, Nara; Nobutaka Fukushima, Tenri; Shigeo Onishi, Nara, all of Japan

[73] Assignee: Sharp Kabushiki Kaisha, Osaka, Japan

[21] Appl. No.: 983,438

[22] Filed: Dec. 3, 1992

[30] Foreign Application Priority Data

Dec. 5, 1991 [JP] Japan .................. 3-349083
Sep. 18, 1992 [JP] Japan .................. 4-249815

[51] Int. Cl.⁵ .......................................... H01L 21/285
[52] U.S. Cl. .................................. 437/192; 437/190; 437/200; 427/97; 427/126.1
[58] Field of Search ................ 437/192, 200; 427/97, 427/99, 123, 124, 125, 126.1, 126.5, 255.2

[56] References Cited

U.S. PATENT DOCUMENTS 5,080,927 1/1992 Ikeda et al. ................ 427/53.1
5,130,172 7/1992 Hicks et al. ................ 427/252

FOREIGN PATENT DOCUMENTS 63-278352 11/1988 Japan .
1-290771 11/1989 Japan .
2-15620 1/1990 Japan .
2-210833 8/1990 Japan .
3-248464 11/1991 Japan .

*Primary Examiner*—T. N. Quach
*Attorney, Agent, or Firm*—Nixon & Vanderhye

[57] ABSTRACT

A method for manufacturing a semiconductor device comprising forming a titanium or titanium compound film by a CVD method which uses a material gas containing an organic titanium compound of the formula (I)

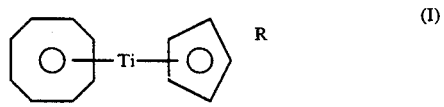

wherein R is a hydrogen atom, a lower alkyl group, a $C_{8-13}$ condensed polycyclic hydrocarbonyl group or a silyl group which is substituted with a lower alkyl and/or an aryl, and a reducing gas.

11 Claims, 5 Drawing Sheets

METHOD FOR MANUFACTURING A SEMICONDUCTOR DEVICE COMPRISING TITANIUM

BACKGROUND OF THE INVENTION

1. Field of the Invention

The invention relates to a method for manufacturing a semiconductor device, and more particularly to a method for forming a titanium or titanium compound film by the CVD method in such semiconductor devices as bipolar LSI, MOS LSI or the like, provided with a contact plug for a multi-layer wiring.

2. Description of the Related Art

Techniques for multi-layer wiring in semiconductor devices provide such advantages that discrete devices can be laid out on a chip without separate consideration of wiring spaces on the chip, thereby enabling devices to be increased in the scale of integration and further microminiaturized. In this regard, there must be good contact between a contact plug and silicon substrate.

The contact plug has hitherto been made of conductive materials, such as W, poly-Si, Al-Si or the like, and a multi-layer wiring of W, Al-Si or the like.

When devices are further microminiaturized, aspect ratios of contact hole inevitably becomes higher and contact resistance increases, resulting in such a defect that the required contact property is unobtainable. Also, the contact plug made of the above conductive materials is extremely sensitive to a natural oxide film on the interface between the contact plug and the silicon substrate and deteriorates the contact property. Particularly when made of tungsten the plug sometimes the erodes silicon substrate to deteriorate the contact property correspondingly to a higher aspect ratio.

Also, the multi-layer wiring has various problems in efficiency and reliability due to the quality of the material used as the width of the wiring is made smaller.

Hence, it is desired to solve the above various problems related to the contact plug and the multi-layer wiring to facilitate development of new devices for the next generation.

Under these circumstances, research has focused on a method for coating a titanium film with good coverage using a CVD method. For coating a titanium film the substrate needs to be heated. In this process, heating the substrate to a decomposition temperature (about 800° C. or more) of e.g., titanium tetrachloride, results in an excessively elevated temperature in the substrate, thereby causing an undesired reaction between Ti and Si. Besides, an aluminum alloy as used for wiring may be affected at such high temperature. Employing plasma energy in place of thermal energy deteriorates the coverage in CVD method. In addition, using titanium tetrachloride as material gas results in a titanium film containing chlorine (Cl). In other words, using titanium tetrachloride has a drawback of allowing wirings to be corroded (due to the difficulty of impeding the infiltration of chlorine content in the titanium film when using aluminum alloy as wirings in the subsequent process).

Thus, only with difficulty does the CVD method using titanium tetrachloride provide a titanium film with only a small amount of impurities and with good coverage at low temperature.

SUMMARY OF THE INVENTION

The present invention provides a method for manufacturing a semiconductor device comprising forming a titanium or titanium compound film by a CVD method which uses a gas

wherein R is a hydrogen atom, a lower alkyl group, a $C_{8-13}$ condensed polycyclic hydrocarbonyl group or a silyl group which is substituted with a lower alkyl and/or an aryl, and a reducing gas.

DETAILED DESCRIPTION OF THE PREFERRED EMBODIMENT

A substrate used for the semiconductor device of this invention may be of any kind that can be used for manufacturing a semiconductor device and is not restricted to any particular kind. A silicon substrate and a compound semiconductor substrate can be used. The compound semiconductor that can be used includes the types using such compounds as GaAs, AlGaAs, InAlAs, InGaAs, InGaAsP, and InP.

The titanium or titanium compound film can be formed in any of the following three different forms using CVD methods The film can be formed directly on any of the above substrates. The film can otherwise be formed indirectly overlaying the substrate by sandwiching between the film and the substrate a desired element such as a transistor or a capacitor initially formed on the substrate and an interlayer insulating film subsequently formed on the desired substrate. The film can otherwise be formed indirectly overlaying the substrate including a contact hole formed in an interlayer insulating film initially formed on the substrate.

In accordance with this invention, the organic titanium compound of the formula (I) is used as material gas for forming a titanium or titanium compound film.

Preferably, the organic titanium compounds include an alicyclic compound of cyclooctatetraene to which an optionally substituted cyclopentadien is bonded by the intermediation of the titanium atom. Examples of the cyclopentadien substitutions are i) a straight chain or branched chain $C_{1-4}$ alkyl group such as methyl, ethyl, propyl, isopropyl, butyl and preferably methyl or t-butyl; ii) a $C_{8-13}$ condensed polycyclic hydrocarbon group such as pentalene, inden, naphthalene and fluorene, preferably inden or fluorene; iii) a silyl group which is substituted by the above mentioned alkyl group or an aryl group (e.g., phenyl), preferably trimethylsilyl group.

The above organic titanium compound is used as material gas in its vapor state. The gas may optionally contain an inert carrier gas such as argon or helium. A reducing gas such as hydrogen or monosilane, disilane or dichlorosilane is essentially used, usually together with the material gas.

The CVD apparatus used in this invention can be of any kind if it is usually used for forming films. A thermal CVD apparatus, reduced pressure CVD apparatus or plasma CVD apparatus can be employed.

Figure 6:
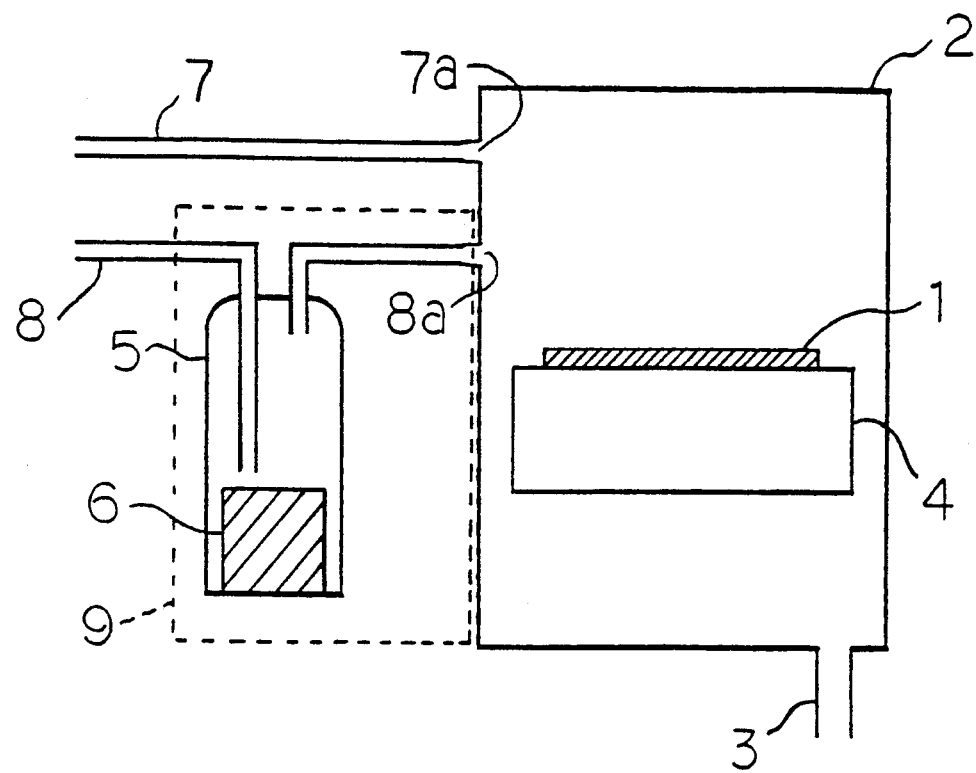
FIG. 6 is a schematic sectional view illustrating CVD apparatus used in the invention.

For example, a thermal CVD apparatus shown in FIG. 6 will be detailed below. The CVD apparatus has a reaction chamber 2 provided with a substrate holding device 4 in which a heating means (not shown in FIG. 6) is embedded. On the side of this reaction chamber 2 are formed a first inlet port 7a and a second inlet port 8a for introducing gas into the reaction chamber 2. To the first inlet port 7a is connected a first inlet pipe 7 while to the second inlet port 8a is connected a second inlet pipe 8. On the opposite side of the first and the second inlet ports 7a, 8a in the reaction chamber 2 is formed a outlet port 3. Further, the second inlet pipe 8 is connected to a cylinder 5 for supplying material gas 6. The second inlet pipe 8 and the cylinder 5 are kept at a desired temperature in a constant temperature tank 9.

In the process of forming the titanium film using such apparatus, a cylinder containing the material gas is initially kept at a temperature ranging from 0° to 350° C. in the constant temperature tank. The optimal temperature is determined depending on the kind of material gas actually employed in this process. For example, in the case of $[(C_8H_8)(C_5H_5)Ti]$, the optimal temperature is set to about 100° C. In the case of $[(C_8H_8)(C_5H_4(CH_3)Ti]$, the optimal temperature is preferably set to about 140° C. The second inlet port connected from the cylinder to the film forming chamber are also kept at about 0° to 350° C., preferably higher by 10° to 30° C. than the temperature in the chamber. The film forming chamber is kept at a sufficiently high vacuum, for example at about $10^{-4}$ torr or less, or preferably about $10^{-8}$ torr or less. The material gas can be supplied from the cylinder to the film forming chamber by using an inert gas such as helium and argon. In the process, the reducing gas such as hydrogen, monosilane, disilane or dichlorsilane gas may be supplied to the film forming chamber. The supply of the material gas and the reducing gas is appropriately adjusted respectively in the scope of about 1 to 1000 SCCM and about 10 to 1000 SCCM. The pressure in the film forming chamber is usually kept at about $10^{-4}$ to $10^3$ torr, preferably 10 torr. The temperature in the film forming chamber is usually kept at about 100° to 800° C., preferably about 300° C. In the process, the temperature of the substrate can be appropriately adjusted with the decomposition temperature of the material gas used therein. It is usually kept at 100° to 800° C., preferably about 400° C.

The semiconductor according to the present invention can be manufactured by forming a desired device and wirings after coating a titanium or titanium compound film in the above process.

The semiconductor device according to the present invention may have a multi-layer wiring structure which may comprise a pile of layered structures each including a lower conductive layer, an insulating film formed a contact hole and an upper conductive layer formed on the insulating film.

The lower conductive layer may use a region of an impurity doped in a semiconductor substrate, or a conductive layer formed on a semiconductor substrate or on a desired device, such as a transistor, a capacitor or the like. The semiconductor substrate is preferably made of silicon but should not be limited thereto. Also, the conductive layer to be formed on a semiconductor substrate or on a desired device may be an electrode or a wiring layer constituting such device as a transistor, a capacitor or the like. The conductive layer may be made of any materials conventionally used for electrodes, preferably polysilicon but not be limited thereto.

Materials for the insulating film can be of any kind but may use $SiO_2$ when the lower conductive layer is formed with the silicon substrate or poly-silicon. The insulating film is provided with a contact hole for connecting the lower and upper conductive layers. Magnitude of the contact hole is not limited particularly, but is preferably the same height with thickness of insulating layer. Example of the contact hole may be formed 0.6-1.0 μm in height and 0.3-1.0 μm in width.

The upper conductive layer may be made of any materials conventionally used for electrodes and preferably of titanium, copper or aluminum, but they should not be limited thereto. Thickness of the upper conductive layer is preferably about 0.3-1.0 μm but not limited thereto particularly and can be arranged correspondingly to magnitude or other factors of devices.

In the present invention, a contact plug made of Ti or titanium compound is buried in the contact hole formed in the insulating film (dielectric interlayer film) on the lower conductive layer. The contact plug can be formed by using the same organic metal compound with the above CVD method.

Further, when the lower conductive layer is formed of either Si or a Si compound, after plugging titanium into the contact hole with the foregoing methods, the contact hole plugged with titanium is subjected to lamp annealing in the atmosphere of nitrogen gas or ammonia gas under $10^{-5}$–$10^3$ Torr at about 450°-800° C. for few seconds to 60 min to subject titanium on the surface of the contact plug to nitrification while simultaneously subjecting the interface between titanium and silicon to silicification, thereby forming a contact plug consisting of either $TiN_x/Ti/TiSi_y$ or $TiN_x/TiSi_y$ (x, y: real number). The layered structure of contact plug may consist of either $TiN_x/Ti/TiSi_y$ or $TiN_x/TiSi_y$ (x, y: real number) depending on specific conditions, such as temperatures, annealing time and the like.

In the present invention, when titanium is used for the contact plug and the upper conductive layer, the contact plug is first formed by the foregoing method and a titanium film is then formed by the same manner on the insulating film including the contact plug and patterned to integrally provide the contact plug and the upper conductive layer.

In case that the contact plug is made of titanium and the upper conductive layer of a Cu film or an aluminum film, a TiN film may be deposited between the contact plug and the upper conductive layer by conventional manners, such as the CVD method using $TiCl_4$ and ammonia or $N_2$ or PVD method with reactive sputtering. Also, a Cu film or an Al film is deposited on the TiN film by the CVD method using $Cu(HFA)_2$ (HFA:-hexafluoro acrylic acetate), triisobutyl aluminum or the like or PVD method with sputtering, followed by patterning the TiN film and the Cu or Al film to complete the contact plug and the upper conductive layer. Thickness of the TiN film is preferably about 0.01–0.3 $\mu$m.

Furthermore, the upper conductive layer is provided on the contact plug and lamp annealing is then carried out in atmosphere of nitrogen gas or ammonia gas under $10^{-5}$–$10^3$ Torr at about 450°–800° C. for few seconds to 60 min, so that a TiN film of thickness about 0.002–0.3 $\mu$m may be formed on the whole surface of the upper conductive layer.

In the present invention, the above mentioned a pile of layered structure can be repeated thereon.

EXAMPLES

Examples of the method for manufacturing a semiconductor device according to the present invention will be detailed.

Initially a silicon substrate 1 was employed as a substrate for forming a titanium or titanium compound film for use in the semiconductor device according to the invention. On the silicon substrate 1 was formed a 1.4 $\mu$m thick interlayer insulating film in which a contact hole with a 4 $\mu$m diameter extending over to the substrate was provided. The silicon substrate 1 was placed on a sample holding device 4 in the CVD device to start forming films.

EXAMPLE 1

A cylinder 5 containing [$(C_8H_8)$ $(C_5H_5)$Ti] used as the material gas was kept at about 100° C. in a constant temperature tank 9 while reducing the pressure in the cylinder 5 to about 1 Torr, thereby giving an appropriate vapor pressure. A second inlet pipe 8 through which the material gas 6 passes was kept at about 110° C. from the cylinder 5 to the film forming chamber 2. Then, to inhibit decomposition and adsorbency in portions other than the film forming chamber 2, Ar gas was allowed to enter into the cylinder 5 to convey material gas 6 to the film forming chamber 2 with it. The film forming chamber 2 is was subjected to a sufficiently high vacuum condition of about $10^{-8}$ Torr while sufficiently exhausting unnecessary elements such as oxygen and the like. The silicon substrate 1 placed in the film forming chamber 2 was heated to about 400° C. Then hydrogen gas was supplied into the film forming chamber 2 as reducing gas from the first inlet pipe 7. The flow rate of each gas was controlled to 300 SCCM, or 500 SCCM so as to keep the pressure in the film forming chamber 2 to about 10 Torr.

In this way, a sufficient supply of $(C_8H_8)$ $(C_5H_5)$Ti used as the material gas to the heated substrate 1 allowed the titanium film to be formed with good coverage and with only a small amount of impurities. Subsequently, by providing a desired wiring, the semiconductor according to the invention was manufactured.

EXAMPLE 2

Example 2 of the semiconductor device provided with a titanium film was manufactured in the same way with Example 1 except that [$(C_8H_8)$ $(C_5H_4(CH_3))$Ti] was used as the material gas, the cylinder 5 was kept at about 140° C. and the second inlet pipe 8 was kept at about 150° C.

[$(C_8H_8)$ $(C_5H_4(CH_3))$Ti] used as the material gas was decomposed, and organic substance such as $C_5H_6$ produced after decomposition was sublimed, thereby allowing a titanium film with good coverage and with only a small amount of impurities to be formed on the silicon substrate 1.

EXAMPLE 3

In Example 3 of the semiconductor device according to the invention, disilane gas ($Si_2H_6$) was employed as the reducing gas introduced into the film forming chamber in the place of hydrogen gas used in Example 1.

Disilane gas was supplied into the film forming chamber 1 at a flow rate of about 200 SCCM into the film forming chamber 1.

[$(C_8H_8)$ $(C_5H_5)$Ti] used as the material was decomposed on the heated silicon substrate 1 to produce titanium silicide ($TiSi_x$) by reacting with disilane. Organic substance such as $C_5H_6$ produced after decomposition was sublimed to form a titanium silicide with good coverage and with a small amount of impurities.

Table 1 shows the coverage of titanium films formed with a thermal CVD device and a plasma CVD device by using the organic metal compounds in the present invention. Table 1 also shows the coverage of titanium films formed with a conventional sputtering process.

TABLE 1

| Film | Coverage (%) |
| --- | --- |
| Example | |
| plasma CVD-TiN | 20 |
| thermal CVD-TiN | 100 |
| thermal CVD-W | 98 |
| Comparative example | |
| sputter-Ti | 7 |
| sputter-TiN | 5 |

Figure 5:
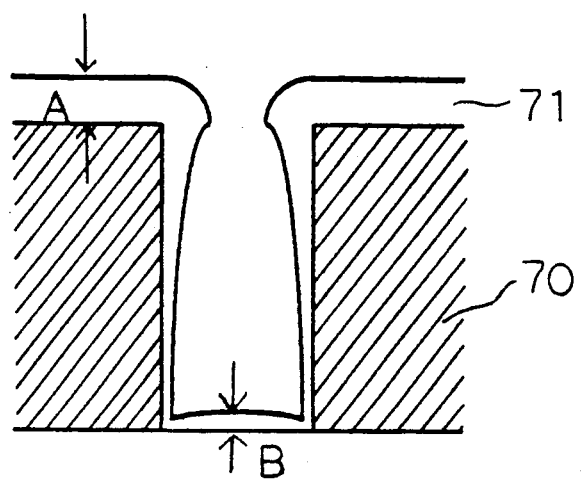
FIG. 5 is a sectional view illustrating the essential portion of the semiconductor device to explain the coverage.

Table 1 clearly shows the method for forming a titanium film according to the present invention provides a titanium film with good coverage. The coverage was calculated as a percentage obtained by dividing the thickness of the titanium film 71 on the bottom of the contact hole by the thickness of the titanium film 71 formed on the insulating film 70 (shown by B/A in FIG. 5).

The method for forming titanium film for use in the semiconductor according to the present invention allows formation of a titanium film with the CVD method by using gas containing an organic metal compound. By allowing the substrate forming a titanium film to react with material gas containing the above organic metal compound while keeping the same substrate at a temperature higher than the decomposition temperature of material gas, material gas heated to the decomposition temperature in the vicinity of the substrate can be decomposed, thereby depositing titanium atoms on the substrate to form a titanium film. Organic compounds produced after decomposition of material gas were sublimed with the heat of the heated substrate. Consequently, a titanium film with good coverage and with only a small amount of impurities can be formed with a low temperature process.

EXAMPLE 4

Figure 1:
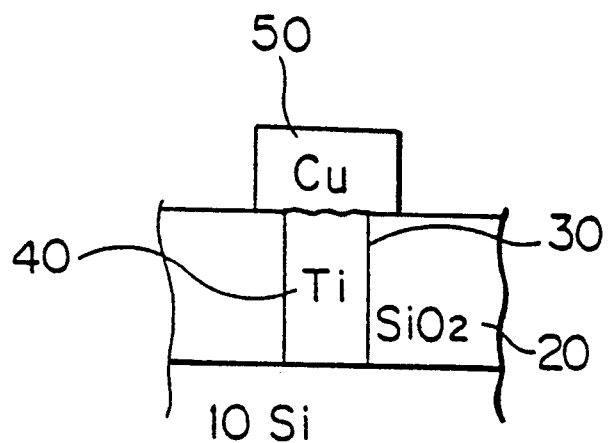
FIG. 1 is a schematic sectional view showing an example of the semiconductor device according to the present invention, particularly, a principal portion of the device structure having a lower wiring layer, a contact plug and an upper conductive layer.

The semiconductor device having the multi-layer wiring structure does, as shown in FIG. 1, comprise a predetermined impurity doped silicon substrate 10 serving as a lower conductive layer and a $SiO_2$ film 20 serving as an insulating film formed on the silicon substrate 10. The $SiO_2$ film 20 has a contact hole 30 about 1.0 μm in height and about 0.4 μm in width. A contact plug 40 made of titanium is buried in the contact hole 30. A Cu film 50 about 0.4 μm in thickness serving as an upper conductive layer is formed on the $SiO_2$ film 20, and the upper surface of the contact plug 40 contacts with the lower surface of the Cu film 50.

The semiconductor device is obtained by the following manufacturing method.

The silicon substrate 10 is first exposed in atmosphere of $SiH_4$ and oxygen at 800° C. to form uniformly on the substrate surface the $SiO_2$ film 20 of thickness of about 1.0 μm The $SiO_2$ film 20 is etched, for example, by photolithography process to make the contact hole 30 about 1.0 μm in height and about 0.4 μm in width.

Natural oxide formed at the bottom of the contact hole 30 is then removed using HF solution and titanium is deposited in the contact hole 30 by the same manner as of Example 1 under the same condition as of Example 1. The titanium film formed on the surface of the $SiO_2$ film 20 is removed by reactive ion etching method to form the contact plug 40.

The Cu film 50 serving as the upper conductive layer is deposited on the $SiO_2$ film 20 including the contact plug 40 by use, for example, of sputtering using Cu as a target. The Cu film 50 is formed into a desired shape by photolithography process and etching process to complete the upper conductive layer of Cu on the contact plug 40.

The semiconductor device constituted as above may have an excellent contact part by making the contact plug 40 with titanium. In detail, titanium deoxidizes oxide film to remove the natural oxide formed on the interface between the silicon substrate 10 and the contact plug 40, thereby providing a stable connection therebetween. Hence, the contact plug 40 has less contact resistance and is superior in reliability against higher aspect ratio following microminiaturization of devices.

EXAMPLE 5

Figure 2:
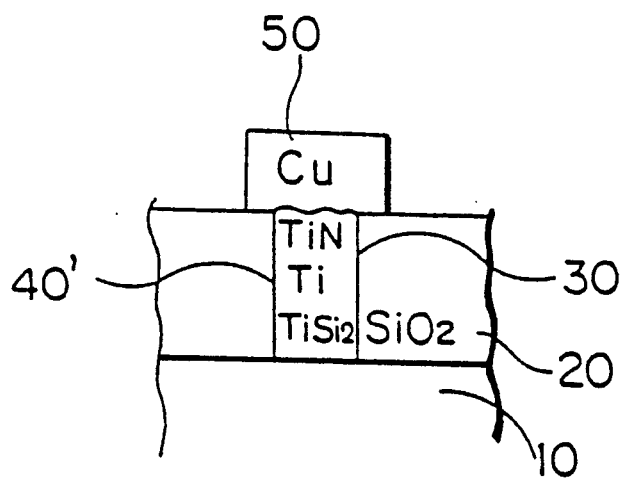
FIG. 2 is a schematic sectional view showing a modified example of the semiconductor device according to the present invention, particularly, a principal portion of the device structure having a lower wiring layer, a contact plug and an upper conductive layer.

The semiconductor device does, as shown in FIG. 2, comprise a predetermined impurity doped silicon substrate 10 serving as a lower conductive layer and a $SiO_2$ film 20 serving as an insulating film formed on the substrate 10. The $SiO_2$ film 20 has a similar contact hole 30 to that of Example 4. A contact plug 40' made of titanium compound is buried in the contact hole 30. The titanium compound has a layered structure of TiN/-Ti/Ti $Si_2$ layered in this order from the upper surface of the contact plug 40'. Also, a similar Cu film 50 to that of Example 4 is formed on the $SiO_2$ film 20.

The semiconductor device is obtained by the following manufacturing method.

The contact hole 30 is first formed in the $SiO_2$ film 20 by the same manner as of Example 4. Titanium is deposited in the contact hole 30 by the same manner as of Example 1 under the same condition as of Example 1, and simultaneously carried out are nitriding titanium on the contact plug surface and forming silicide on the interface between titanium and silicon. 2000 sccm of flow of $N_2$ gas or ammonia gas is applied for nitriding titanium and 200 sccm of flow of $SiH_4$ for forming silicide, so that the contact plug 40' having the layered structure of TiN/Ti/TiSi$_2$ is completed. Alternatively, titanium after deposited in the contact hole 30 may be annealed for nitriding titanium and forming silicide.

An upper conductive layer of Cu is then formed on the contact plug 40' by the same manner as of Example 4.

In the semiconductor device constituted as above, the upper part of the contact plug 40 is made with TiN which is chemically stable, thereby preventing formation of dielectric by titanium contact plug's reaction with oxygen gas or other reactive gas before completion of the upper conductive layer. Also, TiSi$_2$ which is chemically stable and has lower contact resistance is formed on the interface between the silicon substrate 10 and the contact plug 40, thereby providing a highly reliable connection therebetween.

EXAMPLE 6

Figure 3A:
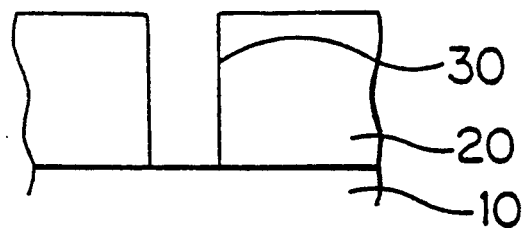
FIGS. 3(a) to 3(d) are schematic diagrams of manufacturing processes showing a manufacturing method for a further modified example of the semiconductor device according to the present invention.
Figure 3B:
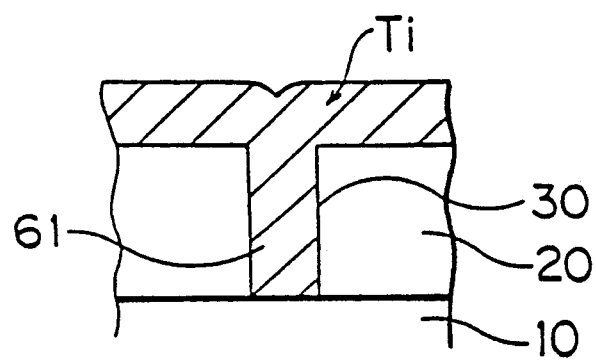
Figure 3C:
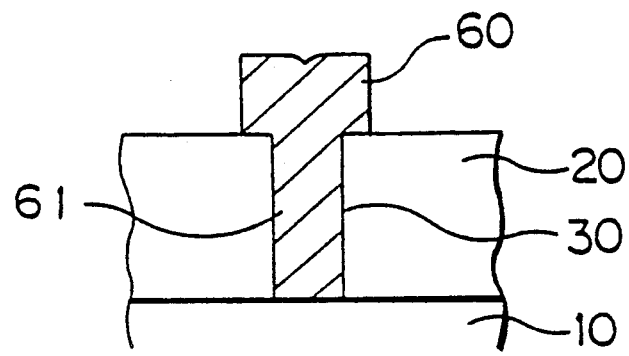
Figure 3D:
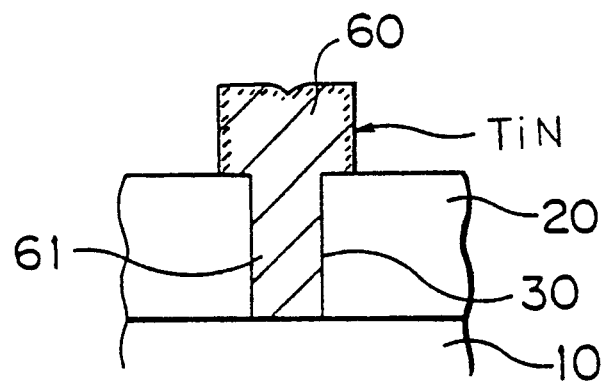

The semiconductor device does, as shown in FIG. 3(d), comprise a predetermined impurity doped silicon substrate 10 serving as a lower conductive layer and a $SiO_2$ film 20 formed thereon and having a similar contact hole 30 to that of Example 4. A contact plug 61 made of titanium is buried in the contact hole 30. An upper conductive layer 60 made of titanium is provided integrally on the contact plug 61. The surface of the upper conductive layer 60 is nitrified.

The semiconductor device is obtained by the following manufacturing method.

The contact hole 30 is first formed in the $SiO_2$ film 20 by the same manner as of Example 4 (FIG. 3(a)).

Natural oxide film formed on the interface of the contact hole 30 is deoxidized and titanium is deposited in the contact hole 30 by the same manner as of Example 1 and also on the surface of the $SiO_2$ film 20 (FIG. 3(b)).

Deposited titanium is patterned into a desired shape to form the upper conductive layer 60 provided integrally with the contact plug 61 (FIG. 3(c)).

Lamp anneal is then carried out in atmosphere of nitrogen under 10 Torr at about 700° C. for about 1 min to nitride the surface of the upper conductive layer 60 (FIG. 3(d)).

In the semiconductor device constructed as above, the contact plug 61 and the upper conductive layer 60 are made with titanium which is chemically stable, thereby achieving an excellent contact property. Generally, when the surface or interface of the contact plug reacts with oxygen or other substances to form any substances not suitable for wiring, such foreign substances may have almost uniform thickness, so that conductive layers when reduced in width and thickness have higher aspect ratio, leading to deterioration of reliability of conductive layers. Nitrifying the surface of the upper conductive layer 60 provides a barrier, so that even when width of the conductive layer is made smaller following microminiaturization of devices, the conductive layer is not deteriorated in its efficiency and reliability. Also, irrespective of higher aspect ratio, a semiconductor device having an excellent contact property and a higher reliability is achieved. Furthermore, the contact plug 61 and the upper conductive layer 60 are prepared by the simple processes of depositing and patterning titanium, facilitating simplification of manufacturing method.

EXAMPLE 7

Figure 4A:
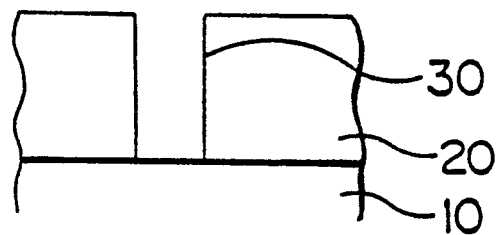
FIGS. 4(a) to 4(d) are schematic diagrams of manufacturing processes showing a manufacturing method for another modified example of the semiconductor device according the present invention.
Figure 4B:
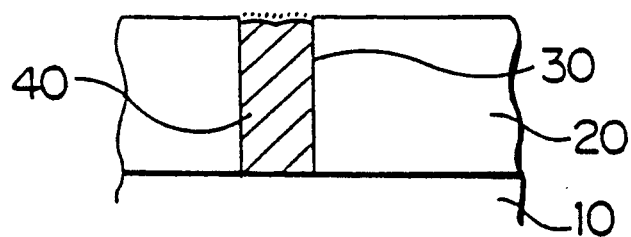
Figure 4C:
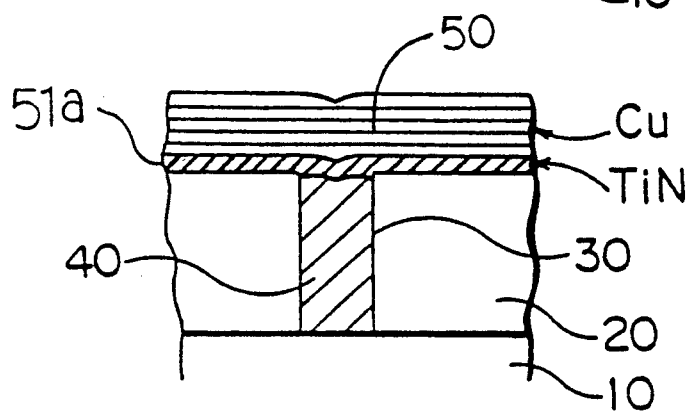
Figure 4D:
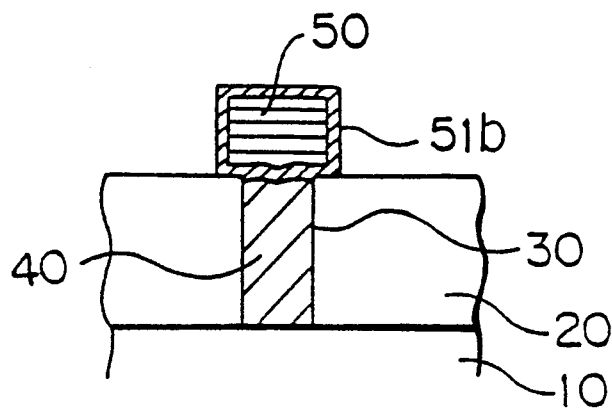

The semiconductor device does, as shown in FIG. 4(d), comprise a predetermined impurity doped silicon substrate 10 serving as a lower conductive layer and a $SiO_2$ film 20 formed thereon and having a similar contact hole 30 to that of Example 4. A contact plug 40 made of titanium is buried in the contact hole 30. An upper conductive layer 50 made of Cu is provided on the contact plug 40 through a TiN film 51. An additional TiN film 50 is deposited on the surface of the upper conductive layer 50.

The semiconductor device is obtained by the following manufacturing method.

The contact hole 30 is first formed in the $SiO_2$ film 20 by the same manner as of Example 4 (FIG. 4(a)).

The contact plug 40 is then formed by the same manner as of Example 1. Lamp anneal is then applied to the surface of the $SiO_2$ film 20 in atmosphere of ammonia gas under about 10 Torr at about 700° C. for about 1 min to nitride the surface of the contact plug 40 (FIG. 4(b)).

On the $SiO_2$ film 20 are formed a TiN film 51a about 0.05 μm in thickness by reactive sputtering method using Ti as a target in atmosphere of $N_2$ gas, and a Cu film 50 about 0.3 μm in thickness by sputtering method using Cu as a target (FIG. 4(c)).

The TiN film 51a and the Cu film 50 are etched at a time by photolithography process to form a desired wiring pattern, and a TiN film 51b is deposited on the surface of the Cu film 50 by the same manner as above (FIG. 4(d)).

The present example refers to the processes that the contact plug 40 is first formed and the TiN film 51a and Cu film 50 are deposited on the plug 40 and etched at a time. Alternatively, TiN film 51a, Cu film 50 and TiN film 51b (about 0.1 μm in thickness) may be deposited on the contact plug 40 and etched at a time.

In the semiconductor device constructed as above, the surface of the contact plug 40 is nitrified and the TiN film 51 is deposited between the contact plug 40 and the upper conductive layer 50 and on the surface thereof, thereby providing an excellent barrier, so that even when width of the conductive layer is made smaller following microminiaturization of devices, the conductive layer is not deteriorated in its efficiency and reliability. Also, irrespective of higher aspect ratio, a semiconductor device having an excellent contact property and a higher reliability is achieved. Furthermore, the contact plug 40 is made with titanium which is chemically stable and has lower resistance, and the wiring layer with Cu which is higher in reliability and has lower resistance and higher migration property. Hence, titanium and Cu cooperatively exhibit their good qualities to achieve a semiconductor device having excellent properties.

What we claim is:

1. A method of manufacturing a semiconductor device comprising forming a titanium or titanium compound film by a CVD method which uses a gas containing an organic titanium compound of the formula (I)

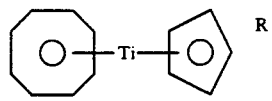

wherein R is a lower alkyl group, a $C_{8-13}$ condensed polycyclic hydrocarbonyl group or a silyl group which is substituted with a lower alkyl and/or an aryl, and a reducing gas, and wherein a titanium silicide film is formed by using a gas containing silicon and hydrogen as a reducing gas.

2. The method of claim 1 wherein the titanium or titanium compound film is formed over any one of a substrate, a substrate having a desired element and an interlayer insulating film thereon or a substrate having desired elements and an interlayer insulating film thereon and further a contact hole formed in the interlayer insulating film.

3. The method of claim 2 wherein the titanium or titanium compound film is formed to cover the interlayer insulating film which has the contact hole formed therein.

4. The method of claim 1 wherein the organic titanium compound is of the formula (I) in which R is a methyl, t-butyl or trimethylsilyl group.

5. A method of manufacturing a semiconductor device comprising:
   a) forming an interlayer insulating film on a lower conductive layer constituted by a substrate itself or formed on a substrate,
   b) forming a contact hole in the interlayer insulating film,
   c) forming a titanium or titanium compound film by a CVD method to bury the contact hole and cover the remaining interlayer insulating film, the CVD method using a gas containing an organic titanium compound of formula (I)

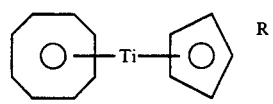

wherein R is a hydrogen atom, a lower alkyl group, a $C_{8-13}$ condensed polycyclic hydrocarbonyl group or a silyl group which is substituted with a lower alkyl and/or an aryl, and a reducing gas,
   d) etching the titanium or titanium compound film on the remaining interlayer insulating film to form a contact plug, and
   e) forming an upper conductive layer thereon.

6. The method of claim 5, wherein a TiN film is further formed before step e).

7. The method of claim 5 wherein the upper conductive layer comprises Cu or Al.

8. The method of claim 5 wherein an annealing is further conducted before step e).

9. The method of claim 5 wherein the upper conductive layer comprises Ti, thereby completing the contact plug integrally with the upper conductive layer.

10. The method of claim 5 wherein a titanium silicide film is formed by using a gas containing silicon and hydrogen as a reducing gas.

11. The method of claim 5 wherein the organic titanium compound is of the formula (I) in which R is a methyl, t-butyl or trimethylsilyl group.

* * * * *